US011158676B2

(12) United States Patent
Leem et al.

(10) Patent No.: US 11,158,676 B2
(45) Date of Patent: Oct. 26, 2021

(54) SENSORS AND ELECTRONIC DEVICES

(71) Applicant: Samsung Electronics Co., Ltd., Suwon-si (KR)

(72) Inventors: Dong-Seok Leem, Seongnam-si (KR); Rae Sung Kim, Hwaseong-si (KR); Hyesung Choi, Seoul (KR); Ohkyu Kwon, Seoul (KR); Changki Kim, Suwon-si (KR); Hwang Suk Kim, Suwon-si (KR); Bum Woo Park, Hwaseong-si (KR); Jae Jun Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/788,857

(22) Filed: Feb. 12, 2020

(65) Prior Publication Data

US 2021/0036061 A1 Feb. 4, 2021

(30) Foreign Application Priority Data

Aug. 1, 2019 (KR) ........................ 10-2019-0093974

(51) Int. Cl.
*H01L 27/30* (2006.01)
*H01L 27/146* (2006.01)
(Continued)

(52) U.S. Cl.
CPC ...... *H01L 27/307* (2013.01); *H01L 27/14669* (2013.01); *H01L 51/424* (2013.01); *H01L 51/4253* (2013.01); *H01L 51/5004* (2013.01)

(58) Field of Classification Search
CPC .................. H01L 51/5004; H01L 51/4253
See application file for complete search history.

(56) References Cited

U.S. PATENT DOCUMENTS 7,326,955 B2 2/2008 Forrest et al.
7,375,370 B2 5/2008 Forrest et al.
(Continued)

FOREIGN PATENT DOCUMENTS

JP         6088954 B2   3/2017
KR  10-2013-0038208 A  4/2013
(Continued)

OTHER PUBLICATIONS

Park et al. "Work Function of Indium Tin Oxide Transparent Conductor Measured by Photoelectron Spectroscopy", Applied Physics Letters, vol. 68 Issue 19, Jun. 1998 (Year: 1998).*
(Continued)

*Primary Examiner* — Selim U Ahmed
*Assistant Examiner* — Evan G Clinton
(74) *Attorney, Agent, or Firm* — Harness, Dickey & Pierce, P.L.C.

(57) ABSTRACT

A sensor includes an anode and a cathode, and a near-infrared photoelectric conversion layer between the anode and the cathode. The near-infrared photoelectric conversion layer is configured to absorb light of at least a portion of a near-infrared wavelength spectrum and convert the absorbed light into an electrical signal. The near-infrared photoelectric conversion layer includes a first material having a maximum absorption wavelength in the near-infrared wavelength spectrum and a second material forming a pn junction with the first material and having a wider energy bandgap than an energy bandgap of the first material. The first material is included in the near-infrared photoelectric conversion layer in a smaller amount than the second material.

17 Claims, 13 Drawing Sheets

(51) Int. Cl.
*H01L 51/42* (2006.01)
*H01L 51/50* (2006.01)

(56) References Cited

U.S. PATENT DOCUMENTS

| | | |
|---|---|---|
| 7,915,701 B2 | 3/2011 | Forrest et al. |
| 8,822,808 B2 | 9/2014 | Hamano |
| 2009/0050881 A1 | 2/2009 | Hayashi |
| 2014/0001455 A1 | 1/2014 | Holmes et al. |
| 2018/0081107 A1 | 3/2018 | Kitaoka et al. |
| 2018/0219047 A1 | 8/2018 | Tokuhara et al. |
| 2019/0081107 A1 | 3/2019 | Nakata et al. |
| 2019/0214591 A1* | 7/2019 | Park .................... H01L 51/4253 |
| 2019/0364191 A1* | 11/2019 | Takahashi ............. H01L 27/146 |

FOREIGN PATENT DOCUMENTS

| | | |
|---|---|---|
| WO | WO-2006/017403 A2 | 2/2006 |
| WO | WO-2017/159192 A1 | 9/2017 |

OTHER PUBLICATIONS

Goncalves et al. "Role of Room Temperature Sputtered High Conductive and High Transparent Indium Zinc Oxide Film Contacts on the Performance of Orange, Green and Blue Organic Light Emitting Diodes", Plasma Processes and Polymers, 2011 (Year: 2011).*

European Search Report dated Sep. 9, 2020 for corresponding European Application No. 20169035.1.

* cited by examiner

SENSORS AND ELECTRONIC DEVICES

CROSS-REFERENCE TO RELATED APPLICATION

This application claims priority to and the benefit of Korean Patent Application No. 10-2019-0093974 filed in the Korean Intellectual Property Office on Aug. 1, 2019, the entire contents of which are incorporated herein by reference.

BACKGROUND

1. Field

Sensors and electronic devices are disclosed.

2. Description of the Related Art

Imaging devices are used in digital cameras, camcorders, etc., to capture an image and to store it as an electrical signal. An imaging device includes an image sensor separating incident light according to a wavelength and converting each component to an electrical signal.

Recently, photoelectric diodes in a near infra-red wavelength spectrum have been researched to improve sensitivity of a sensor in low illumination environment or to be used as a biometric or authentication device.

SUMMARY

Some example embodiments provide a sensor that exhibits improved electrical characteristics.

Some example embodiments provide an electronic device including the sensor.

According to some example embodiments, a sensor may include an anode and a cathode, and a near-infrared photoelectric conversion layer between the anode and the cathode. The near-infrared photoelectric conversion layer may be configured to absorb light of at least a portion of a near-infrared wavelength spectrum and convert the absorbed light into an electrical signal. The near-infrared photoelectric conversion layer may include a first amount of a first material having a maximum absorption wavelength in the near-infrared wavelength spectrum, and a second amount of a second material forming a pn junction with the first material. The second material may have a wider energy bandgap than an energy bandgap of the first material. The first amount may be smaller than the second amount.

A difference between a highest occupied molecular orbital (HOMO) energy level of the first material and a work function of the cathode may be less than about 1.0 eV.

A difference between a highest occupied molecular orbital (HOMO) energy level of the second material and a HOMO energy level of the first material may be greater than or equal to about 1.0 eV.

A difference between a highest occupied molecular orbital (HOMO) energy level of the second material and a work function of the cathode may be greater than or equal to about 1.5 eV.

An energy bandgap of the second material may be wider than the energy bandgap of the first material by about 0.5 eV to about 2.0 eV.

A maximum absorption wavelength of the second material may be not within the near-infrared wavelength spectrum.

A composition ratio of the first material relative to the second material may be about 0.10 to about 0.90.

A composition ratio of the first material relative to the second material may be about 0.10 to about 0.50.

The near-infrared photoelectric conversion layer may include a mixed layer including a mixture of the first material and the second material.

A maximum absorption wavelength of the near-infrared photoelectric conversion layer may be within about 750 nm to about 1500 nm.

The sensor may further include a charge auxiliary layer between the near-infrared photoelectric conversion layer and the cathode.

A difference between a highest occupied molecular orbital (HOMO) energy level of the charge auxiliary layer and a work function of the cathode may be greater than or equal to about 1.5 eV.

The sensor may further include a charge auxiliary layer between the near-infrared photoelectric conversion layer and the anode.

A difference between a lowest unoccupied molecular orbital (LUMO) energy level of the charge auxiliary layer and a work function of the anode may be greater than or equal to about 1.5 eV.

The sensor may further include a semiconductor substrate, wherein the cathode, anode, and near-infrared photoelectric conversion layer are stacked on the semiconductor substrate.

The sensor may further include a visible light sensor configured to detect light in a visible wavelength spectrum.

The visible light sensor may include a blue sensor configured to sense light in a blue wavelength spectrum, a green sensor configured to sense light in a green wavelength spectrum, and a red sensor configured to sense light in a red wavelength spectrum. The blue sensor, the green sensor and the red sensor may be integrated in the semiconductor substrate.

The visible light sensor may include a blue sensor configured to sense light in a blue wavelength spectrum, a green sensor configured to sense light in a green wavelength spectrum, and a red sensor configured to sense light in a red wavelength spectrum. Two sensors of the blue sensor, the green sensor, or the red sensor may be photodiodes integrated in the semiconductor substrate, and a remaining one sensor of the blue sensor, the green sensor, and the red sensor may be a photoelectric conversion device on the semiconductor substrate.

The photoelectric conversion device may include a visible photoelectric conversion layer between a pair of electrodes, the visible photoelectric conversion layer configured to absorb visible light of one wavelength spectrum of the blue wavelength spectrum, the green wavelength spectrum, or the red wavelength spectrum to convert the absorbed visible light into a visible light electrical signal.

The visible light sensor may include a blue sensor configured to sense light in a blue wavelength spectrum, a green sensor configured to sense light in a green wavelength spectrum, and a red sensor configured to sense light in a red wavelength spectrum. Each sensor of the blue sensor, the green sensor, and the red sensor may be a photoelectric conversion device.

The blue sensor may include a blue photoelectric conversion layer configured to absorb first light in the blue wavelength spectrum and convert the first light into a first electrical signal. The green sensor may include a green photoelectric conversion layer configured to absorb second light in the green wavelength spectrum and convert the second light into a second electrical signal. The red sensor may include a red photoelectric conversion layer configured to absorb third light in the red wavelength spectrum and convert the third light into a third electrical signal.

An electronic device may include the sensor.

According to some example embodiments, a sensor may include an anode and a cathode, and a near-infrared photoelectric conversion layer between the anode and the cathode. The near-infrared photoelectric conversion layer may be configured to absorb light of at least a portion of a near-infrared wavelength spectrum and convert the absorbed light into an electrical signal. The near-infrared photoelectric conversion layer may include a first amount of a first material having a maximum absorption wavelength in the near-infrared wavelength spectrum, and a second amount of a second material forming a pn junction with the first material. The second material may have a maximum absorption wavelength that is not in the near-infrared wavelength spectrum. The first amount may be smaller than the second amount.

The second material may have a wider energy bandgap than an energy bandgap of the first material.

A difference between a highest occupied molecular orbital (HOMO) energy level of the first material and a work function of the cathode may be less than about 1.0 eV.

A difference between a highest occupied molecular orbital (HOMO) energy level of the second material and a HOMO energy level of the first material may be greater than or equal to about 1.0 eV.

A difference between a highest occupied molecular orbital (HOMO) energy level of the second material and a work function of the cathode may be greater than or equal to about 1.5 eV.

An energy bandgap of the second material may be wider than an energy bandgap of the first material by about 0.5 eV to about 2.0 eV.

A composition ratio of the first material relative to the second material may be about 0.10 to about 0.90.

A composition ratio of the first material relative to the second material may be about 0.10 to about 0.50.

The near-infrared photoelectric conversion layer may include a mixed layer including a mixture of the first material and the second material.

A maximum absorption wavelength of the near-infrared photoelectric conversion layer may be within about 750 nm to about 1500 nm.

The electrical characteristics of the sensor may be improved.

DETAILED DESCRIPTION

Figure 1:
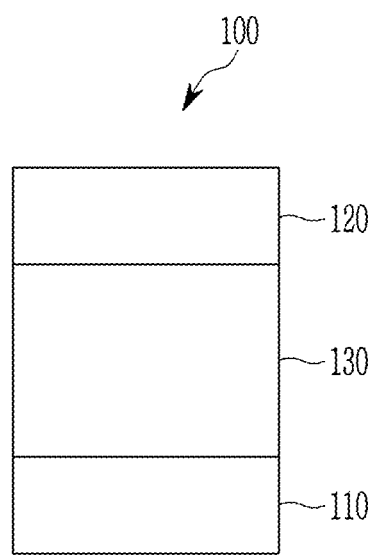
FIG. 1 is a cross-sectional view showing an example of a near-infrared light sensor according to some example embodiments.

Hereinafter, example embodiments of the present inventive concepts will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, a work function, a highest occupied molecular orbital (HOMO) energy level, or a lowest unoccupied molecular orbital (LUMO) energy level is expressed as an absolute value from a vacuum level. In addition, when the work function, HOMO energy level, or LUMO energy level is referred to be deep, high, or large, it may have a large absolute value based on "0 eV" of the vacuum level while when the work function, HOMO energy level, or LUMO energy level is referred to be shallow, low, or small, it may have a small absolute value based on "0 eV" of the vacuum level.

Hereinafter, an energy bandgap refers to an absolute value of a difference between the HOMO energy level and LUMO energy level, the wide energy bandgap means that an absolute value of the difference between the HOMO energy level and LUMO energy level is large.

Hereinafter, a sensor according to some example embodiments is described.

The sensor according to some example embodiments includes a sensor configured to sense light in a near-infrared wavelength spectrum (hereinafter, referred to as a "near-infrared light sensor"). The near-infrared light sensor is a sensor configured to sense light in at least a portion of the near-infrared wavelength spectrum. For example, the near-infrared light sensor may be configured to selectively absorb light at least a portion of the near-infrared wavelength spectrum and convert the light into an electrical signal. The near-infrared light sensor may exhibit an absorption spectrum having a maximum absorption wavelength in the near-infrared wavelength spectrum. The near-infrared wavelength spectrum may be for example within greater than about 700 nm and less than or equal to about 3000 nm, within the range, for example about 750 nm to about 3000 nm, about 750 nm to about 2000 nm, about 750 nm to about 1800 nm, about 750 nm to about 1500 nm, about 750 nm to about 1300 nm, about 750 nm to about 1200 nm, about 750 nm to about 1100 nm, or about 750 nm to about 1000 nm.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

The near-infrared light sensor may include each independently a photo-sensing device such as photodiode or a photoelectric conversion device.

FIG. 1 is a cross-sectional view showing an example of a near-infrared light sensor according to some example embodiments.

Referring to FIG. 1, a near-infrared light sensor 100 (also referred to herein as "a sensor") according to some example embodiments includes a first electrode 110 and a second electrode 120 facing each other (e.g., opposing each other) and a near-infrared photoelectric conversion layer 130 between the first electrode 110 and second electrode 120.

A substrate (not shown) may be disposed at the side of the first electrode 110 (e.g., directly or indirectly on surface 110a) or the second electrode 120 (e.g., directly or indirectly on surface 120a). The substrate may be for example made of (e.g., may at least partially comprise) an inorganic material such as glass, an organic material such as polycarbonate, polymethylmethacrylate, polyethyleneterephthalate, polyethylenenaphthalate, polyamide, polyethersulfone, or a combination thereof, or a silicon wafer. The substrate may be omitted.

One of the first electrode 110 or the second electrode 120 is an anode and the other is a cathode. For example, the first electrode 110 may be an anode, and the second electrode 120 may be a cathode. For example, the first electrode 110 may be a cathode, and the second electrode 120 may be an anode.

At least one of the first electrode 110 or the second electrode 120 may be a transparent electrode. The transparent electrode may have a high transmittance of greater than or equal to about 80%, greater than or equal to about 85%, greater than or equal to about 88%, or greater than or equal to about 90% and may include, for example at least one of an oxide conductor, a carbon conductor, and/or a metal thin film. The oxide conductor may be for example one or more selected from indium tin oxide (ITO), indium zinc oxide (IZO), zinc tin oxide (ZTO), aluminum tin oxide (AITO), and aluminum zinc oxide (AZO). The carbon conductor may be one or more selected from graphene and carbon nanostructure. The metal thin film may be for example formed with a thin thickness of several nanometers to several tens of nanometer thickness or may be a single layer or multiple layers of metal thin film formed with a thin thickness of several nanometers to tens of nanometer thickness and doped with metal oxide.

One of the first electrode 110 or the second electrode 120 may be a reflecting electrode. The reflecting electrode may have for example a low transmittance of less than about 10% or less than or equal to about 5%. The reflecting electrode may include a reflecting conductor such as a metal and may include, for example aluminum (Al), silver (Ag), gold (Au), or an alloy thereof.

For example, the first electrode 110 and the second electrode 120 may each be a transparent electrode. For example, the first electrode 110 may be a reflecting electrode and the second electrode 120 may be a transparent electrode. For example, the first electrode 110 may be a transparent electrode and the second electrode 120 may be a reflecting electrode.

The near-infrared photoelectric conversion layer 130 may be configured to absorb light in at least a portion of the near-infrared wavelength spectrum and convert the absorbed light into an electrical signal. The absorption spectrum of the near-infrared photoelectric conversion layer 130 may be for example exhibited in a wavelength spectrum of greater than about 700 nm and less than or equal to about 3000 nm, within the range, for example about 750 nm to about 3000 nm, about 750 nm to about 2000 nm, about 750 nm to about 1800 nm, about 750 nm to about 1500 nm, about 750 nm to about 1300 nm, about 750 nm to about 1200 nm, about 750 nm to about 1100 nm, or about 750 nm to about 1000 nm. The maximum absorption wavelength of the near-infrared photoelectric conversion layer 130 may be for example exhibited in a wavelength spectrum of greater than about 700 nm and less than or equal to about 3000 nm, within the range, for example about 750 nm to about 3000 nm, about 750 nm to about 2000 nm, about 750 nm to about 1800 nm, about 750 nm to about 1500 nm, about 750 nm to about 1300 nm, about 750 nm to about 1200 nm, about 750 nm to about 1100 nm, or about 750 nm to about 1000 nm.

The near-infrared photoelectric conversion layer 130 may include at least one first material and at least one second material that collectively form a pn junction. One of the first material or the second material may be a p-type semiconductor, and the other may be an n-type semiconductor. The first material may be a p-type semiconductor, and the second material may be an n-type semiconductor. The first material may be an n-type semiconductor, and the second material may be a p-type semiconductor.

The first material and the second material may each be an organic material, an inorganic material, or an organic/inorganic material, respectively, and for example at least one of the first material or the second material may be an organic material. At least one of the first material or the second material may be a light absorbing material, and for example the first material and the second material may be each a light absorbing material.

The first material and the second material may have different light absorption characteristics. The absorption spectrum of the first material and the absorption spectrum of the second material may be different. The maximum absorption wavelength of the first material and the maximum absorption wavelength of the second material may be different. For example, the absorption spectrum of the first material may be shown in a longer wavelength spectrum than the absorption spectrum of the second material and the maximum absorption wavelength of the first material may be a longer wavelength than the maximum absorption wavelength of the second material.

For example, the first material may be a near-infrared absorbing material configured to primarily absorb light in the near-infrared wavelength spectrum, and the maximum absorption wavelength of the first material may be within the near-infrared wavelength spectrum. The maximum absorption wavelength of the first material may be for example within a range of greater than about 700 nm and less than or equal to about 3000 nm, within the range, for example about 750 nm to about 3000 nm, about 750 nm to about 2000 nm, about 750 nm to about 1800 nm, about 750 nm to about 1500 nm, about 750 nm to about 1300 nm, about 750 nm to about 1200 nm, about 750 nm to about 1100 nm, or about 750 nm to about 1000 nm.

The second material may not be a near-infrared absorbing material configured to primarily absorb light in the near-infrared wavelength spectrum, and the maximum absorption wavelength of the second material may not be within the near-infrared wavelength spectrum. For example, the second material may be a visible absorbing material configured to primarily absorb light in the visible wavelength spectrum and not the near-infrared wavelength spectrum and the maximum absorption wavelength of the second material may be within the visible wavelength spectrum and not within the near-infrared wavelength spectrum. The visible wavelength spectrum may be greater than or equal to 380 nm and less than 700 nm, within the range, for example about 380 nm to about 680 nm. In another example, the second material may be an ultraviolet absorbing material configured to primarily absorb light in the ultraviolet wavelength spectrum and not the near-infrared wavelength spectrum and the maximum absorption wavelength of the second material may be within the ultraviolet wavelength spectrum and not within the near-infrared wavelength spectrum. The ultraviolet wavelength spectrum may be greater than or equal to 10 nm and less than 400 nm. It will be understood that in some example embodiments, the second material may be a near-infrared absorbing material configured to primarily absorb light in the near-infrared wavelength spectrum, and the maximum absorption wavelength of the second material may be within the near-infrared wavelength spectrum.

The first material and the second material may have different electrical characteristics. For example, the energy diagram of the first material and the energy diagram of the second material may be different.

For example, the first material may have a relatively shallow HOMO energy level. For example, the first material may have a HOMO energy level of about 4.0 eV to about 5.5 eV. The HOMO energy level of the second material may be deeper than the HOMO energy level of the first material. For example, a difference between the HOMO energy level of the second material and the HOMO energy level of the first material may be greater than or equal to about 0.8 eV, greater than or equal to about 0.9 eV, or greater than or equal to about 1.0 eV, for example about 0.8 eV to about 2.0 eV, about 0.8 eV to about 1.8 eV, about 0.8 eV to about 1.7 eV, or about 0.8 eV to about 1.5 eV, about 0.9 eV to about 2.0 eV, about 0.9 eV to about 1.8 eV, about 0.9 eV to about 1.7 eV, or about 0.9 eV to about 1.5 eV, about 1.0 eV to about 2.0 eV, about 1.0 eV to about 1.8 eV, about 1.0 eV to about 1.7 eV, or about 1.0 eV to about 1.5 eV. For example, the HOMO energy level of the second material may be about 5.6 eV to about 7.0 eV.

For example, the LUMO energy level of the first material may be about 3.0 eV to about 4.5 eV. The LUMO energy level of the second material may be deeper or shallower than the LUMO energy level of the first material, and the LUMO energy level of the second material may be about 3.6 eV to about 5.0 eV.

For example, the energy bandgap of the first material may be about 0.5 eV to about 1.5 eV. The energy bandgap of the second material may be wider than the energy bandgap of the first material, but example embodiments not limited thereto and in some example embodiments the energy bandgap of the second material may be not wider than the energy bandgap of the first material. For example, the energy bandgap of the second material may be wider than the energy bandgap of the first material by greater than or equal to about 0.3 eV, within the range, greater than or equal to about 0.5 eV, greater than or equal to about 0.7 eV, greater than or equal to about 0.8 eV, or greater than or equal to about 1.0 eV. For example, the energy bandgap of the second material may be wider than the energy bandgap of the first material by about 0.3 eV to about 2.0 eV, about 0.5 eV to about 2.0 eV, about 0.7 eV to about 2.0 eV, about 0.8 eV to about 2.0 eV, or about 1.0 eV to about 2.0 eV. For example, the energy bandgap of the second material may be about 0.8 eV to about 2.4 eV.

The near-infrared photoelectric conversion layer 130 may include a mixed layer in which the first material and the second material are mixed in a bulk heterojunction form (e.g., the near-infrared photoelectric conversion layer 130 may include a bulk heterojunction mixture of the first material and the second material), such that the pn junction includes the mixed layer of the first material and the second material. The near-infrared photoelectric conversion layer 130 may, in some example embodiments, include a mixture of first and second materials and that define the pn junction, including a mixture that includes a bulk heterojunction of the first and second materials, a graded heterojunction of the first and second materials, a continuous junction of the first and second materials, a discrete heterojunction of the first and second materials, a homogenous mixture of the first and second materials, any combination thereof, or the like. The mixed layer may include the first material and the second material in a particular (or, alternatively, predetermined) composition ratio, wherein the composition ratio, sometimes referred to herein as a ratio of the first material relative to the second material, may be defined as a ratio of a volume or a thickness of the first material relative to a volume or a thickness of the second material. The composition ratio may be defined as a ratio of an amount (e.g., "first amount") of the first material relative to an amount (e.g., "second amount") of the second material.

As described herein, an "amount" of the first material and/or the second material may refer to a volume, thickness, and/or mass of the respective material being described.

For example, the near-infrared photoelectric conversion layer 130 may include a first amount of the first material and a second amount of the second material, where the first amount is smaller than the second amount, and the composition ratio of the first material relative to the second material in the near-infrared photoelectric conversion layer 130 may be about 0.10 to about 0.90. Within the range, the composition ratio of the first material relative to the second material may be about 0.10 to about 0.80, about 0.10 to about 0.70, about 0.10 to about 0.50, or about 0.10 to about 0.30.

As such, a dark current of the near-infrared light sensor 100 may be effectively reduced by controlling the composition ratio of the first material and the second material in the near-infrared photoelectric conversion layer 130.

Specifically, in the near-infrared light sensor 100, light enters through the first electrode 110 or the second electrode 120, and the near-infrared photoelectric conversion layer 130 is configured to absorb light of a particular (or, alternatively, predetermined) wavelength spectrum, thereby generating excitons therein. The excitons are separated into holes and electrons in the near-infrared photoelectric conversion layer 130, and the separated holes move to the anode that is one of the first electrode 110 or the second electrode 120, and the separated electrons move to the cathode that is the other of the first electrode 110 and the second electrode 120 so as to flow an electrical current.

Herein, since the first material of the near-infrared photoelectric conversion layer 130 has a relatively shallow HOMO energy level as described above, the energy barrier with the cathode is low, which may inadvertently increase a dark current under a reverse bias voltage. For example, considering that the work function of the cathode is generally about 4.0 eV to 4.7 eV, an energy barrier between the first material and the cathode, that is, a difference between the HOMO energy level of the first material and the work function of the cathode is for example less than about 1.0 eV, less than about 0.8 eV, less than about 0.7 eV, less than about 0.6 eV, or less than about 0.5 eV, so that a charge such as a hole flows back from the cathode to the near-infrared photoelectric conversion layer 130 under a reverse bias voltage, and thus an unfavorable dark current may be increased.

In contrast, since the second material of the near-infrared photoelectric conversion layer 130 has a deeper HOMO energy level than the first material as described above, the second material may form a sufficient energy barrier with the cathode, thereby suppressing a dark current under a reverse bias voltage. For example, considering that the work function of the cathode is about 4.0 eV to 4.7 eV, an energy barrier between the second material and the cathode, that is, a difference between the HOMO energy level of the second material and the work function of the cathode may be for example relatively large of greater than or equal to about 1.5 eV, greater than or equal to about 1.7 eV, greater than or equal to about 1.8 eV, greater than or equal to about 2.0 eV, about 1.5 eV to about 2.5 eV, about 1.7 eV to about 2.5 eV, about 1.8 eV to about 2.5 eV, or about 2.0 eV to about 2.5 eV, so that a charge such as a hole may be prevented or reduced from flowing back from the cathode to the near-infrared photoelectric conversion layer 130 under a reverse bias voltage and thus a dark current may be suppressed.

Therefore, the dark current of the near-infrared light sensor 100 may be effectively reduced by lowering the composition ratio of the first material relative to the second material in the near-infrared photoelectric conversion layer 130. For example, by controlling the composition ratio of the first material relative to the second material to be for example less than about 1, about 0.10 to about 0.90, about 0.10 to about 0.80, about 0.10 to about 0.70, about 0.10 to about 0.50, about 0.10 to about 0.40, about 0.10 to about 0.35, or about 0.10 to about 0.30, a dark current of the near-infrared light sensor 100 may be effectively suppressed. Restated, the near-infrared photoelectric conversion layer 130 may include a first amount of the first material and a second amount of the second material forming the pn junction with the first material (e.g., a mixture of the first amount of the first material and the second amount of the second material), where the first amount is smaller than the second amount, such that the near-infrared photoelectric conversion layer 130 includes a smaller amount of the first material than the second material.

The near-infrared photoelectric conversion layer 130 may have a thickness of about 100 nm to about 500 nm, within the range, about 150 nm to about 500 nm, about 200 nm to about 500 nm, or about 230 nm to about 500 nm.

Hereinafter, a sensor according to some example embodiments is described.

Figure 2:
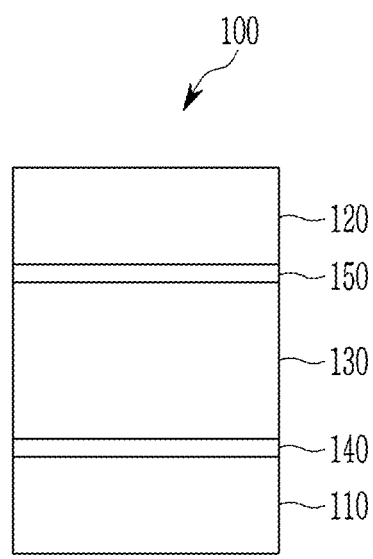
FIG. 2 is a cross-sectional view showing another example of a near-infrared light sensor according to some example embodiments.

FIG. 2 is a cross-sectional view showing another example of a near-infrared light sensor according to some example embodiments.

Referring to FIG. 2, a near-infrared light sensor 100 according to some example embodiments includes a first electrode 110 and a second electrode 120 facing each other and a near-infrared photoelectric conversion layer 130 between the first electrode 110 and second electrode 120, like the aforementioned example embodiments.

However, in some example embodiments, the near-infrared light sensor 100 according to the present example further includes charge auxiliary layers 140 and 150 between the first electrode 110 and the near-infrared photoelectric conversion layer 130 and/or between the second electrode 120 and the near-infrared photoelectric conversion layer 130. The charge auxiliary layers 140 and 150 may increase efficiency of the near-infrared light sensor 100 by controlling a mobility of the holes and/or electrons separated from the near-infrared photoelectric conversion layer 130.

For example, when the first electrode 110 is an anode and the second electrode 120 is a cathode, the charge auxiliary layer 140 may be a hole injection layer (HIL) for facilitating hole injection, a hole transport layer (HTL) for facilitating hole transport, and/or an electron blocking layer (EBL) for preventing electron transport and the charge auxiliary layer 150 may be an electron injection layer (EIL) for facilitating electron injection, an electron transport layer (ETL) for facilitating electron transport, and/or a hole blocking layer (HBL) for preventing hole transport.

For example, when the first electrode 110 is a cathode and the second electrode 120 is an anode, the charge auxiliary layer 140 may be a an electron injection layer (EIL) for facilitating electron injection, an electron transport layer (ETL) for facilitating electron transport, and/or a hole blocking layer (HBL) for preventing hole transport and the charge auxiliary layer 150 may be a hole injection layer (HIL) for facilitating hole injection, a hole transport layer (HTL) for facilitating hole transport, and/or an electron blocking layer (EBL) for preventing electron transport.

For example, one of the charge auxiliary layers 140 or 150 may include the first material or the second material, and one of the charge auxiliary layers 140 or 150 may include the second material. In some example embodiments, for example where the charge auxiliary layer 140 is between the near-infrared photoelectric conversion layer 130 and a first electrode 110 that is a cathode, the charge auxiliary layer 140 may include the second material, such that a difference between the HOMO energy level of the charge auxiliary layer 140 and the work function of the cathode may be for example relatively large of greater than or equal to about 1.5 eV, greater than or equal to about 1.7 eV, greater than or equal to about 1.8 eV, greater than or equal to about 2.0 eV, about 1.5 eV to about 2.5 eV, about 1.7 eV to about 2.5 eV, about 1.8 eV to about 2.5 eV, or about 2.0 eV to about 2.5 eV. In some example embodiments, for example where the charge auxiliary layer 150 is between the near-infrared photoelectric conversion layer 130 and a second electrode 120 that is an cathode, the charge auxiliary layer 150 may include the first material, such that a difference between the LUMO energy level of the charge auxiliary layer 150 and the work function of the anode may be for example relatively large of greater than or equal to about 1.5 eV, greater than or equal to about 1.7 eV, greater than or equal to about 1.8 eV, greater than or equal to about 2.0 eV, about 1.5 eV to about 2.5 eV, about 1.7 eV to about 2.5 eV, about 1.8 eV to about 2.5 eV, or about 2.0 eV to about 2.5 eV.

Any one charge auxiliary layer of the charge auxiliary layers 140 or 150 may be omitted.

The near-infrared light sensor 100 may be applied to (e.g., included in) a variety of sensors for sensing light in near-infrared wavelength spectrums, for example a sensor to improve sensitivity in low-illumination environments, a sensor to extend a dynamic range specifically classifying a black/white contrast and thus to increase sensing capability of a long distance 3-dimensional image, or a biometric sensor. The biometric sensor may be for example an iris sensor, a depth sensor, a fingerprint sensor, or a blood vessel distribution sensor, but is not limited thereto. The near-infrared light sensor 100 may be for example applied to a CMOS near-infrared light sensor or a CMOS image sensor.

Figure 3:
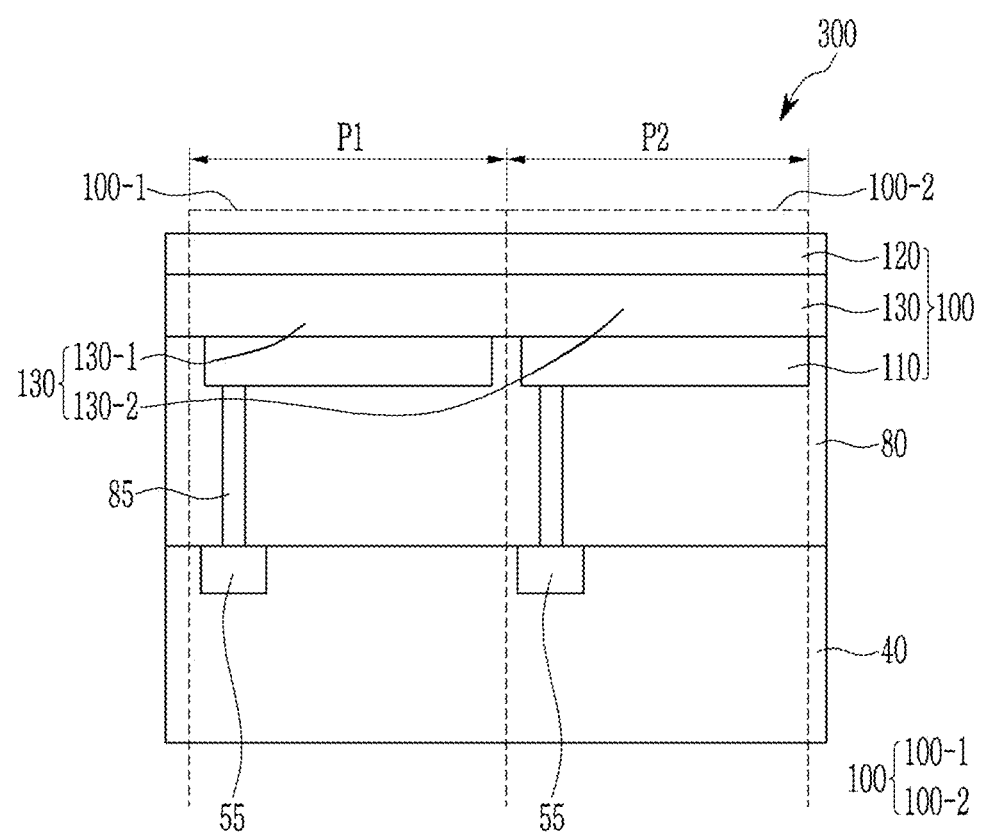
FIG. 3 is a cross-sectional view showing an example of a sensor according to some example embodiments.

FIG. 3 is a cross-sectional view showing an example of a sensor according to some example embodiments.

The sensor 300 according to some example embodiments includes a semiconductor substrate 40, an insulation layer 80, and a near-infrared light sensor 100.

The semiconductor substrate 40 may be a silicon substrate and is integrated with a transmission transistor (not shown) and a charge storage 55. The charge storage 55 may be integrated in each pixel. The charge storage 55 is electrically connected to the near-infrared light sensor 100 and information of the charge storage 55 may be transmitted by the transmission transistor.

A metal wire (not shown) and a pad (not shown) are formed on the semiconductor substrate 40. In order to decrease signal delay, the metal wire and pad may be made of a metal having low resistivity, for example, aluminum (Al), copper (Cu), silver (Ag), and alloys thereof, but is not limited thereto. However, it is not limited to the structure and the metal wire and pads may be disposed under the semiconductor substrate 40.

The insulation layer 80 is formed on the metal wire and the pad. The insulation layer 80 may be made of an inorganic insulating material such as a silicon oxide and/or a silicon nitride, or a low dielectric constant (low K) material such as SiC, SiCOH, SiCO, and SiOF. The insulation layer 80 has a trench 85 exposing the charge storage 55. The trench 85 may be filled with fillers.

The aforementioned near-infrared light sensor 100 is formed on the insulation layer 80. The near-infrared light sensor 100 includes the first electrode 110, the second electrode 120, and the near-infrared photoelectric conversion layer 130 as described above, and may further optionally include a charge auxiliary layer (not shown). As shown, the first electrode 110, the second electrode 120, and the near-infrared photoelectric conversion layer 130 are stacked on (e.g., above) the semiconductor substrate 40.

Both of the first electrode 110 and the second electrode 120 may be a transparent electrode and the first electrode 110, the second electrode 120, and the near-infrared photoelectric conversion layer 130 are the same as described above. Light of the near-infrared wavelength spectrum among the light incident from the second electrode 120 may be effectively absorbed by the near-infrared photoelectric conversion layer 130 and then photoelectrically converted. As described above, by controlling the composition ratio of the first material and the second material of the near-infrared photoelectric conversion layer 130, the dark current may be effectively suppressed under a reverse bias voltage, thereby enabling the near-infrared light sensor 100 to exhibit good photoelectric conversion characteristics.

In FIG. 3, an example including the near-infrared light sensor 100 of FIG. 1 is illustrated, but is not limited thereto. The near-infrared light sensor 100 of FIG. 2 may be also included.

In some example embodiments, as shown in FIG. 3, separate first electrodes 110 may define separate pixels P1, P2 of the sensor 300, where each pixel includes some or all of the portion of the sensor 300 included within the region having lateral boundaries defined by the lateral boundaries of the separate, respective first electrodes 110. Separate portions of the near-infrared light sensor 100 in separate pixels P1, P2 of the sensor 300 may be referred to as separate sub-sensors 100-1, 100-2 where each separate sub-sensor 100-1, 100-2 may be defined by including a separate first electrode 110 and/or a separate near-infrared photoelectric conversion layer 130-1, 130-2 of the near-infrared photoelectric conversion layer 130.

In some example embodiments, as shown in FIG. 3, separate pixels of the sensor 300 may include separate near-infrared photoelectric conversion layers 130-1 and 130-2 that may be at least partially coplanar with each other and collectively define the near-infrared photoelectric conversion layer 130, such that separate sub-sensors 100-1, 100-2 in separate pixels include separate, respective near-infrared photoelectric conversion layers 130-1 and 130-2. In some example embodiments, each separate near-infrared photoelectric conversion layer 130-1 and 130-2 is configured to absorb and photoelectrically convert light of a different near-infrared wavelength spectrum, such that separate sub-sensors 100-1, 100-2 in separate pixels are configured to photoelectrically convert different wavelength spectra of near-infrared light. In some example embodiments, each separate near-infrared photoelectric conversion layer 130-1 and 130-2 includes a different first material (e.g., different material and/or compound composition of first material) and/or a different second material e.g., different material and/or compound composition of second material) than other first and second materials of other near-infrared photoelectric conversion layers 130-1, 130-2 of the sensor 300. In some example embodiments, each separate near-infrared photoelectric conversion layer 130-1 and 130-2 includes a different composition ratio of the first and second materials.

Focusing lens (not shown) may be further formed on the near-infrared light sensor 100. The focusing lens may control a direction of incident light and gather the light in one region. The focusing lens may have a shape of, for example, a cylinder or a hemisphere, but is not limited thereto.

Figure 4:
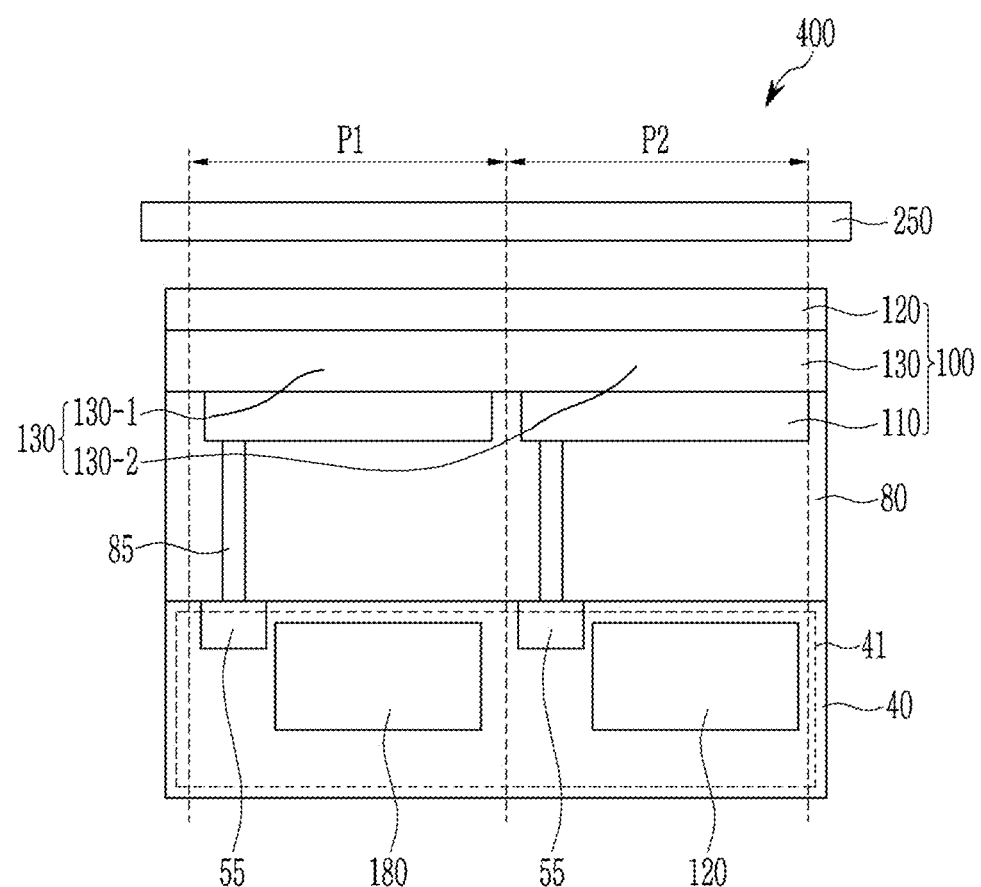
FIG. 4 is a cross-sectional view showing an example of a sensor according to some example embodiments.

FIG. 4 is a cross-sectional view showing an example of a sensor according to some example embodiments.

The sensor according to some example embodiments may include a plurality of sensors having different functions. At least one sensor of a plurality of sensors having different functions may be a biometric sensor. The biometric sensor may be for example an iris sensor, a depth sensor, a fingerprint sensor, or a blood vessel distribution sensor, but is not limited thereto. For example, one sensor of a plurality of sensors having different functions may be an iris sensor and the other may be a depth sensor.

For example, a plurality of sensors may include a first infrared light sensor configured to sense light in a near-infrared region having a first wavelength ($\lambda_1$) and a second infrared light sensor configured to sense infrared light having a second wavelength ($\lambda_2$) within a near-infrared wavelength spectrum.

The first wavelength ($\lambda_1$) and the second wavelength ($\lambda_2$) may differ from each other within a wavelength spectrum of for example greater than about 700 nm and less than or equal to about 3000 nm. For example, a difference between the first wavelength ($\lambda_1$) and the second wavelength ($\lambda_2$) may be greater than or equal to about 30 nm, greater than or equal to about 50 nm, greater than or equal to about 70 nm, greater than or equal to about 80 nm, or greater than or equal to about 90 nm.

For example, one of the first wavelength ($\lambda_1$) or the second wavelength ($\lambda_2$) may be within a wavelength spectrum of about 750 nm to about 900 nm and the other of the first wavelength ($\lambda_1$) or the second wavelength ($\lambda_2$) may be within a wavelength spectrum of about 800 nm to about 1000 nm.

The sensor 400 according to some example embodiments includes an optical filter 250, an upper near-infrared light sensor 100, an insulation layer 80, and a semiconductor substrate 40 in which a lower near-infrared light sensor 180 is integrated. The upper near-infrared light sensor 100 and the lower near-infrared light sensor 180 are stacked.

The optical filter 250 may be disposed at the front side of the sensor 400 and configured to selectively transmit near-infrared light including the first wavelength ($\lambda_1$) and near-infrared light including the second wavelength ($\lambda_2$), and block and/or absorb other light. Herein other light may also include light of ultraviolet (UV) and visible regions.

The upper near-infrared light sensor 100 may be the same as the near-infrared light sensor 100 of the aforementioned example embodiments, and a detailed description thereof is omitted. In FIG. 4, an example including the near-infrared light sensor 100 of FIG. 1 is illustrated, but is not limited thereto. The near-infrared light sensor 100 of FIG. 2 may be also included.

The lower near-infrared light sensor 180 may be integrated in the semiconductor substrate 40 (e.g., at least partially within the volume 41 defined by outer surfaces of the semiconductor substrate 40) and may be a photodiode. The semiconductor substrate 40 may be for example a silicon substrate, in which a lower near-infrared light sensor 180, a charge storage 55, and a transmission transistor (not shown) are integrated.

The light that is flowed into the lower near-infrared light sensor 180 may be light passing through the optical filter 250 and the upper near-infrared light sensor 100, and may be near-infrared light in a particular (or, alternatively, predetermined) region including a second wavelength ($\lambda_2$). The near-infrared light of a particular (or, alternatively, predetermined) region including the first wavelength ($\lambda_1$) may be all substantially absorbed in the near-infrared photoelectric conversion layer 130 of the upper near-infrared light sensor 100 and not reach the lower near-infrared light sensor 180. Herein, a separate filter for wavelength selectivity of light flowing in the lower near-infrared light sensor 180 is not needed. However, when the near-infrared light of a particular (or, alternatively, predetermined) region including the first wavelength ($\lambda_1$) is not all absorbed in the near-infrared photoelectric conversion layer 130, a filter (not shown) between the upper near-infrared light sensor 100 and the lower near-infrared light sensor 180 may be additionally equipped.

The sensor according to some example embodiments may not only include two near-infrared light sensors performing separate functions and thus function as a combination sensor but also maintain a size by stacking the two sensors performing the separate functions in each pixel and greatly improve sensitivity by doubling the number of the pixel.

Figure 5:
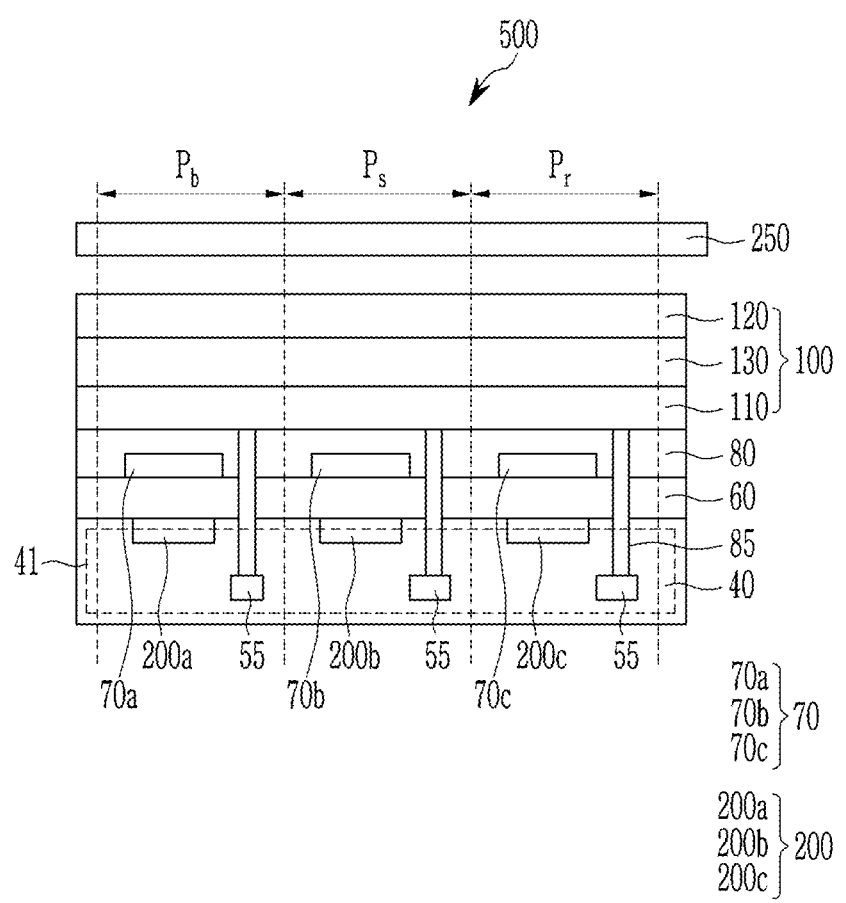
FIG. 5 is a cross-sectional view showing an example of a sensor according to some example embodiments.

FIG. 5 is a cross-sectional view showing an example of a sensor according to some example embodiments.

Referring to FIG. 5, the sensor 500 according to some example embodiments includes a near-infrared light sensor 100, a visible light sensor 200, and an optical filter 250.

The near-infrared light sensor 100 includes a first electrode 110, a second electrode 120, and a near-infrared photoelectric conversion layer 130 disposed between the first electrode 110 and the second electrode 120, as described above. Specific details thereof are the same as described above.

The visible light sensor 200 is a sensor configured to sense light in the visible wavelength spectrum and may be a photodiode integrated in the semiconductor substrate 40. The visible light sensor 200, and thus sensors 200a, 200b, 200c thereof, may be integrated in the semiconductor substrate 40 (e.g., located at least partially within a volume 41 defined by outer surfaces of the semiconductor substrate 40) and may include a blue sensor 200a (e.g., blue photodiode) configured to sense light in a blue wavelength spectrum, a green sensor 200b (e.g., green photodiode) configured to sense light in a green wavelength spectrum, and a red sensor 200c (e.g., red photodiode) configured to sense light in a red wavelength spectrum. The blue sensor 200a may be integrated in the blue pixel Pb, the green sensor 200b may be integrated in the green pixel Pg, and the red sensor 200c may be integrated in the red pixel Pr. It will be understood that, as shown in FIG. 5, a "pixel" may refer to a portion of the sensor 500 that is horizontally defined by the lateral boundaries (e.g., horizontal width) of a separate sensor 200a, 200b, or 200c and encompasses some or all of the portions of the sensor 500 that are vertically overlapping with and/or laterally adjacent to the respective sensor 200a, 200b, or 200c within horizontal boundaries of the pixel defined by the respective sensor 200, 200b, 200c.

The semiconductor substrate 40 may be a for example a silicon substrate, and is integrated with a visible light sensor 200, a charge storage 55, and a transmission transistor (not shown). The visible light sensor 200 may sense light in a visible wavelength range passing through the optical filter 250, the near-infrared light sensor 100, and the color filter layer 70, and the sensed information may be transmitted by the transmission transistor. The charge storage 55 is electrically connected to the near-infrared light sensor 100.

A metal wire (not shown) and a pad (not shown) are formed on the semiconductor substrate 40. In order to decrease signal delay, the metal wire and pad may be made of a metal having low resistivity, for example, aluminum (Al), copper (Cu), silver (Ag), and alloys thereof, but is not limited thereto. However, it is not limited to the structure and the metal wire and pads may be disposed under the blue sensor 200a, the green sensor 200b, and the red sensor 200c.

The lower insulation layer 60 is formed on the semiconductor substrate 40. The lower insulation layer 60 may be made of an inorganic insulating material such as a silicon oxide and/or a silicon nitride, or a low dielectric constant (low K) material such as SiC, SiCOH, SiCO, and SiOF.

The color filter layer 70 is formed on the lower insulation layer 60. The color filter layer 70 may include a blue filter 70a configured to selectively transmit light in the blue wavelength spectrum, a green filter 70b configured to selectively transmit light in a green wavelength spectrum, and a red filter 70c configured to selectively transmit light in the red wavelength spectrum. The blue filter 70a, the green filter 70b, and the red filter 70c are each overlapped with the blue sensor 200a, the green sensor 200b, and the blue sensor 200c. The blue filter 70a may selectively transmit light in a blue wavelength spectrum, the green filter 70b may selectively transmit light in a green wavelength spectrum, and the red filter 70c may selectively transmit light in the red wavelength spectrum. The transmitted light of the blue wavelength spectrum may flow into the blue sensor 200a, the transmitted light of a green wavelength spectrum may flow into the green sensor 200b, and the transmitted light of the red wavelength spectrum may flow into the red sensor 200c. However, the present disclosure is not limited thereto, but at least one of the blue filter 70a, the green filter 70b, or the red filter 70c may be replaced with a yellow filter, a cyan filter, or a magenta filter. Herein, the color filter layer 70 is disposed between the near-infrared light sensor 100 and the visible light sensor 200 but not limited thereto and may be disposed on the near-infrared light sensor 100.

An upper insulation layer 80 is formed on the color filter layer 70. The upper insulation layer 80 may be for example a planarization layer. The lower insulation layer 60 and the upper insulation layer 80 may have has a trench 85 exposing the charge storage 55. The trench 85 may be filled with fillers. At least one of the lower insulation layer 60 or the upper insulation layer 80 may be omitted.

The optical filter 250 is disposed on the visible light sensor 200 and the near-infrared light sensor 100 and specifically, on the whole surface thereof. The optical filter 250 may selectively transmit light of a wavelength sensed in the visible light sensor 200 and light of a wavelength sensed in the near-infrared light sensor 100 but reflect or absorb and thus block light of the other wavelengths.

Focusing lens (not shown) may be further formed on the upper or lower surface of the optical filter 250. The focusing lens may control a direction of incident light and gather the light in one region. The focusing lens may have a shape of, for example, a cylinder or a hemisphere, but is not limited thereto.

Figure 6:
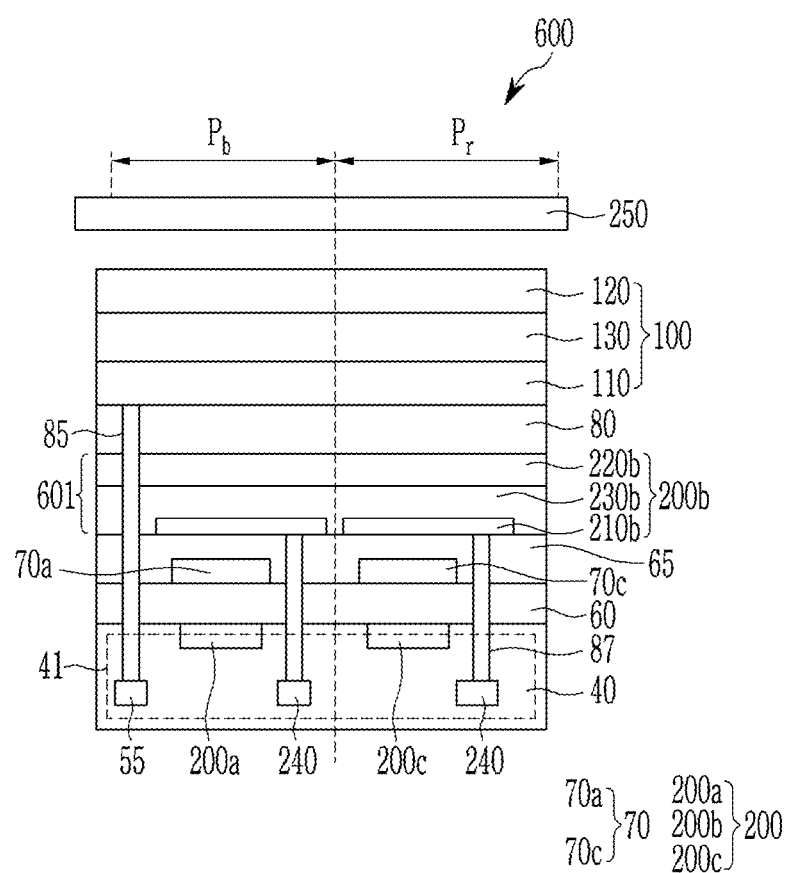
FIG. 6 is a cross-sectional view showing an example of a sensor according to some example embodiments.

FIG. 6 is a cross-sectional view showing an example of a sensor according to some example embodiments.

The sensor 600 according to some example embodiments includes a near-infrared light sensor 100, a visible light sensor 200, and an optical filter 250, like the aforementioned example embodiments.

The near-infrared light sensor 100 includes a first electrode 110, a second electrode 120, and a near-infrared photoelectric conversion layer 130 disposed between the first electrode 110 and the second electrode 120, and specific details thereof are the same as described above.

A visible light sensor 200 may be a combination of a photodiode integrated in the semiconductor substrate 40 and a photoelectric conversion device disposed on the semiconductor substrate 40. As shown in FIG. 6, the visible light sensor 200 may include two sensors (e.g., two of the blue sensor 200a, the green sensor 200b, or the red sensor 200c) that are photodiodes integrated in the semiconductor substrate 40 (e.g., the blue and red sensors 200a and 200c within the volume 41 as shown in FIG. 6), and a remaining one sensor (e.g., of the blue sensor 200a, the green sensor 200b, or the red sensor 200c) may be a photoelectric conversion device 601 on the semiconductor substrate 40.

In the semiconductor substrate 40, a blue sensor 200a, a red sensor 200b, charge storages 55 and 240, and a transmission transistor (not shown) are integrated. The blue sensor 200a and the red sensor 200b are photodiodes and disposed apart from each other in a horizontal direction of the semiconductor substrate 40. The blue sensor 200a is integrated in a blue pixel Pb, and the red sensor 200b is integrated in a red pixel Pr.

On the semiconductor substrate 40, a lower insulation layer 60 and a color filter layer 70 are formed. The color filter layer 70 includes a blue filter 70a overlapped with the blue sensor 200a and a red filter 70c overlapped with the red sensor 200c.

An intermediate insulation layer 65 is formed on the color filter layer 70. The lower insulation layer 60 and the intermediate insulation layer 65 may have trenches 85 and 87 exposing the charge storages 55 and 240. The trenches 85 and 87 may be filled with fillers. At least one of the lower insulation layer 60 or the intermediate insulation layer 65 may be omitted.

On the intermediate insulation layer 65, the green sensor 200b is formed. The green sensor 200b may be a photoelectric conversion device 601 and disposed on the whole surface. The green sensor 200b includes a lower electrode 210b and an upper electrode 220b facing each other and a green photoelectric conversion layer 230b between disposed between the lower electrode 210b and the upper electrode 220b. Either one of the lower electrode 210b or the upper electrode 220b is an anode, while the other one is a cathode.

Both of the lower electrode 210b and the upper electrode 220b may be light-transmitting electrodes. The light-transmitting electrode may be for example made of a transparent conductor such as indium tin oxide (ITO), indium zinc oxide (IZO) or may be a metal thin film formed with a thin thickness of several nanometers to several tens of nanometer thickness or a single layer or multiple layers of metal thin film formed with a thin thickness of several nanometers to tens of nanometer thickness and doped with metal oxide.

The green photoelectric conversion layer 230b may be configured to selectively absorb light in a green wavelength spectrum and allow light from wavelength spectrums other than the green wavelength spectrum, that is, the blue wavelength spectrum and the red wavelength spectrum, to pass through. The green photoelectric conversion layer 230b may be formed on the whole surface of the sensor 600. As a result, light in a green wavelength spectrum is configured to be absorbed from the whole surface of the sensor 600 and increases light areas, thus having high absorption efficiency.

The green photoelectric conversion layer 230b may be configured to selectively absorb light of a green wavelength spectrum, form excitons, and separate the excitons into holes and electrons, and as the separated holes move towards the anode which is one of the lower electrode 210b or the upper electrode 220b, while the separated electrons move toward the cathode which is the other one of the lower electrode 210b or the upper electrode 220b, a photoelectric conversion effect may be obtained. The separated electrons and/or holes may be gathered in charge storages 240.

An auxiliary layer (not shown) may be further included between the lower electrode 210b and the green photoelectric conversion layer 230b and/or between the upper electrode 220b and the green photoelectric conversion layer 230b. The auxiliary layer may be a charge auxiliary layer, a light absorbing auxiliary layer, or a combination thereof but is not limited thereto.

Herein, an example structure in which the blue sensor 200a and the red sensor 200c are photodiodes and the green sensor 200b is a photoelectric conversion device is described, but is not limited thereto. The blue sensor 200a and the green sensor 200b may be photodiodes and the red sensor 200c may be a photoelectric conversion device or the green sensor 200b and the red sensor 200c may be photodiodes and the blue sensor 200a may be a photoelectric conversion device. Accordingly, it will be understood that the photoelectric conversion device 601 may include a visible photoelectric conversion layer (e.g., 230b) between a pair of electrodes (e.g., 210b and 220b) and configured to absorb visible light of one wavelength spectrum of a blue wavelength spectrum, a green wavelength spectrum, or a red wavelength spectrum to convert the absorbed visible light into a visible light electrical signal.

On the green sensor 200b, an upper insulation layer 80 is formed, and on the upper insulation layer 80, the near-infrared light sensor 100 and the optical filter 250 are disposed. The near-infrared light sensor 100 and the optical filter 250 are the same as described above.

The sensor 600 according to some example embodiments is a combination sensor equipped with the near-infrared light sensor 100 and the visible light sensor 200 stacked each other, and the visible light sensor 200 also has a structure of stacking the photodiode and the photoelectric conversion device and thus may further reduce an area of the sensor and thus down-size the sensor.

Figure 7:
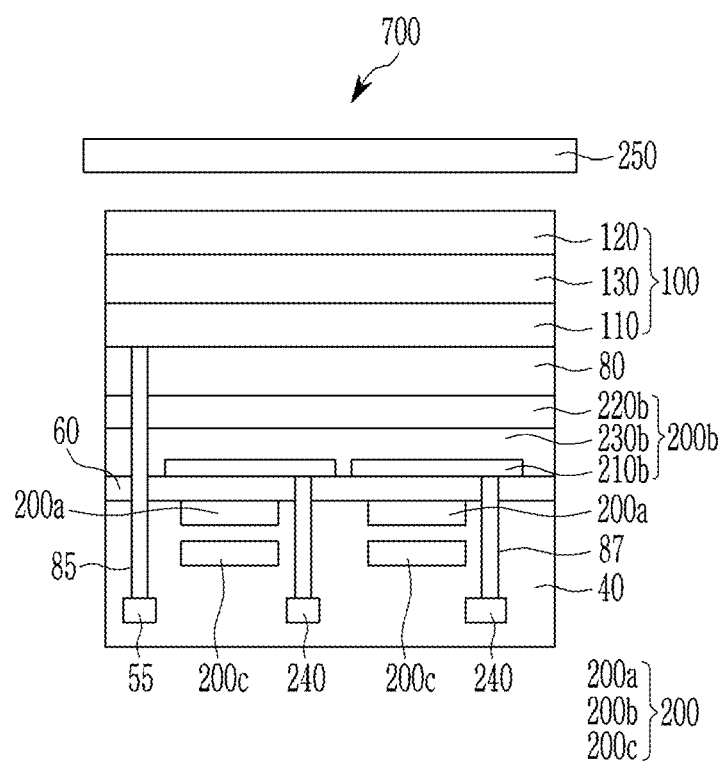
FIG. 7 is a schematic cross-sectional view showing an example of a sensor according to some example embodiments.

FIG. 7 is a schematic cross-sectional view showing an example of a sensor according to some example embodiments.

Referring to FIG. 7, the sensor 700 according to some example embodiments includes a near-infrared light sensor 100, a visible light sensor 200, and an optical filter 250, like the aforementioned example embodiments.

The near-infrared light sensor 100 includes a first electrode 110, a second electrode 120, and a near-infrared photoelectric conversion layer 130 between the first electrode 110 and the second electrode 120, and specific details thereof are the same as described above.

The visible light sensor 200 includes a blue sensor 200a and a red sensor 200c integrated in a semiconductor substrate 40 and a green sensor 200b n the semiconductor substrate 40. The blue sensor 200a and red sensor 200c may be photodiodes and the green sensor 200b may be a photoelectric conversion device. The green sensor 200b includes a lower electrode 210b, a green photoelectric conversion layer 230b, and an upper electrode 220b.

However, in the sensor 700 according to some example embodiments, the blue sensor 200a and the red sensor 200c integrated in the semiconductor substrate 40 in a vertical direction are stacked. The blue sensor 200a and the red sensor 200c may be configured to selectively absorb and sense light of each wavelength spectrum depending on a stacking depth. In other words, the red sensor 200c configured to absorb red light of a long wavelength spectrum may be disposed deeper than the blue sensor 200a configured to absorb blue light of a short wavelength spectrum from the surface of the semiconductor substrate 40. In this way, the color filter layer 70 may be omitted by separating absorption wavelengths depending on a stacking depth.

Herein, an example structure in which the blue sensor 200a and the red sensor 200c are photodiodes and the green sensor 200b is a photoelectric conversion device is described, but is not limited thereto. The blue sensor 200a and the green sensor 200b may be photodiodes and the red sensor 200c may be a photoelectric conversion device or the green sensor 200b and the red sensor 200c may be photodiodes and the blue sensor 200a may be a photoelectric conversion device.

The sensor 700 according to some example embodiments is a combination sensor equipped with the near-infrared light sensor 100 and the visible light sensor 200 stacked each other, and herein, since the visible light sensor 200 also may be equipped with the photodiode and the photoelectric conversion device stacked each other, and the photodiode also has a stacking structure, an area of the sensor may be further reduced, and accordingly, the sensor may be downsized. In addition, the sensor 700 according to some example embodiments may not include a separate color filter layer and thus simplify a structure and a process.

Figure 8:
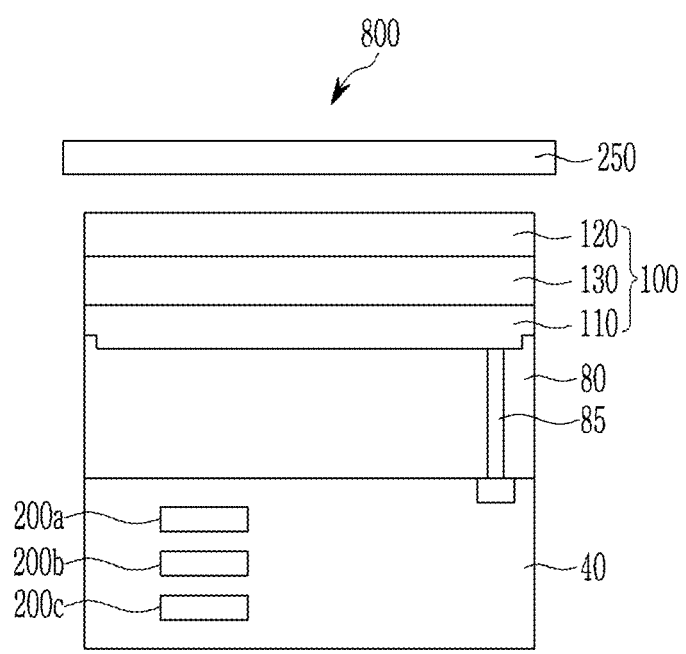
FIG. 8 is a schematic cross-sectional view showing an example of a sensor according to some example embodiments.

FIG. 8 is a schematic cross-sectional view showing an example of a sensor according to some example embodiments.

Referring to FIG. 8, the sensor 800 according to some example embodiments includes a near-infrared light sensor 100, a visible light sensor 200, and an optical filter 250, like the aforementioned example embodiments.

The near-infrared light sensor 100 includes a first electrode 110, a second electrode 120, and a near-infrared photoelectric conversion layer 130 between the first electrode 110 and the second electrode 120, and specific details thereof are the same as described above.

The visible light sensor 200 includes a blue sensor 200a, a green sensor 200b, and a red sensor 200c integrated in a semiconductor substrate 40. The blue sensor 200a, the green sensor 200b, and the red sensor 200c are stacked in a vertical direction in the semiconductor substrate 40. The blue sensor 200a, the green sensor 200b, and the red sensor 200c may separate an absorption wavelength according to a stacking depth, and thus the color filter layer 70 may be omitted. An insulation layer 60 is formed between the semiconductor substrate 40 and the near-infrared light sensor 100 and the insulation layer 60 has a trench 85. The semiconductor substrate 40 includes a charge storage 55 that is connected to the near-infrared light sensor 100.

Figure 9:
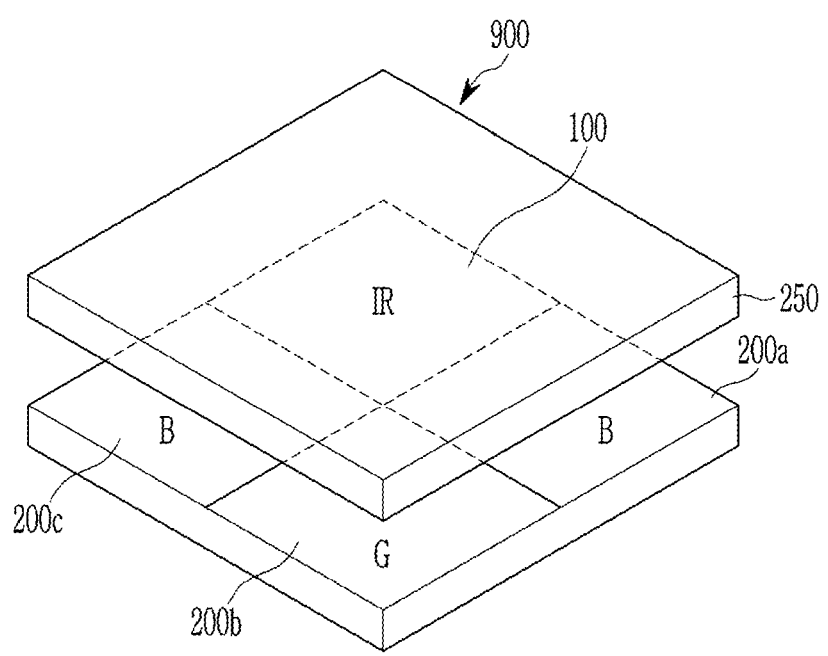
FIG. 9 is a perspective view showing an example of a sensor according to some example embodiments.
Figure 10:
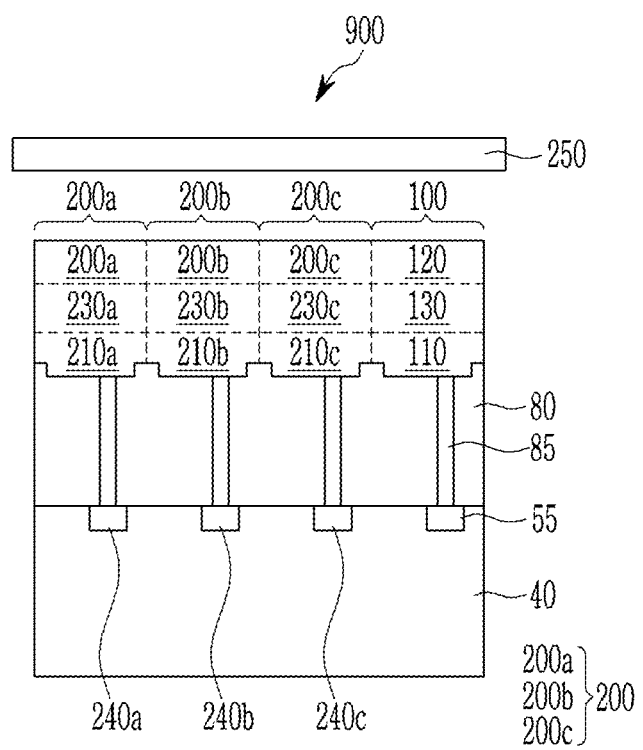
FIG. 10 is a schematic cross-sectional view showing an example of the sensor shown in FIG. 9.

FIG. 9 is a perspective view showing an example of a sensor according to some example embodiments and FIG. 10 is a schematic cross-sectional view showing an example of the sensor shown in FIG. 9.

Referring to FIGS. 9 and 10, the sensor 900 according to some example embodiments includes a semiconductor substrate 40; a near-infrared light sensor 100; a visible light sensor 200; an insulation layer 80; and an optical filter 250. The visible light sensor 200 includes a blue sensor 200a, a green sensor 200b, and a red sensor 200c. As shown in FIGS. 9 and 10, each sensor of the blue sensor 200a, the green sensor 200b, and the red sensor 200c may be a photoelectric conversion device.

The near-infrared light sensor 100, the blue sensor 200a, the green sensor 200b, and the red sensor 200c may be stacked in a horizontal direction on the semiconductor substrate 40, and may be each connected to charged storages 55, 240a, 240b, and 240c integrated in the semiconductor substrate 40.

The near-infrared light sensor 100, the blue sensor 200a, the green sensor 200b, and the red sensor 200c are each photoelectric conversion device.

The near-infrared light sensor 100 includes a first electrode 110, a second electrode 120, and a near-infrared photoelectric conversion layer 130 disposed between the first electrode 110 and the second electrode 120, and specific details thereof are the same as described above.

The blue sensor 200a includes a lower electrode 210a, a blue photoelectric conversion layer 230a, and an upper electrode 220a. The green sensor 200b includes a lower electrode 210b, a green photoelectric conversion layer 230b, and an upper electrode 220b. The red sensor 200c includes a lower electrode 210c, a red photoelectric conversion layer 230c, and an upper electrode 220c. The blue photoelectric conversion layer 230a may be configured to selectively absorb light in a blue wavelength spectrum to perform photoelectric conversion, the green photoelectric conversion layer 230b may be configured to selectively absorb light in a green wavelength spectrum to perform photoelectric conversion, and the red photoelectric conversion layer 230c may be configured to selectively absorb light in a red wavelength spectrum to perform photoelectric conversion. Restated, the blue sensor 200a includes a blue photoelectric conversion layer 230a configured to absorb light in the blue wavelength spectrum (e.g., first light) and convert the light into a first electrical signal, the green sensor 200b includes a green photoelectric conversion layer 230b configured to absorb light in a green wavelength spectrum (e.g., second light) and convert the light into a second electrical signal, and the red sensor 200c includes a red photoelectric conversion layer 230c configured to absorb light in a red wavelength spectrum (e.g., third light) and convert the light into a third electrical signal.

Figure 11:
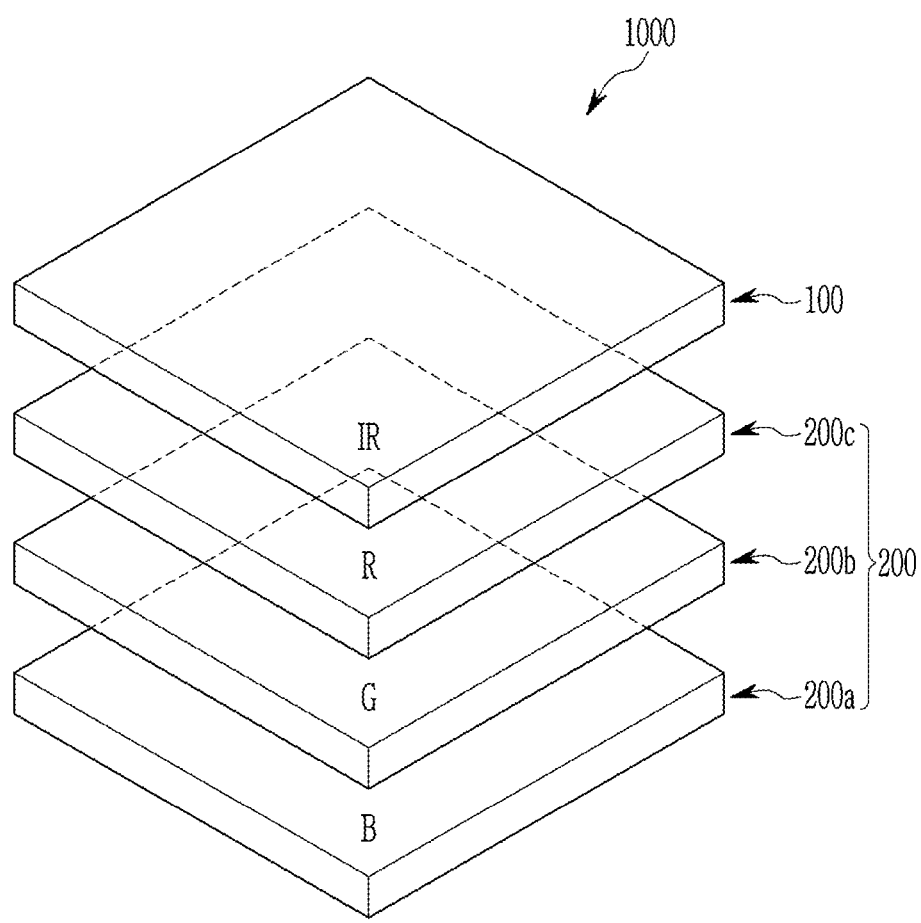
FIG. 11 is a perspective view showing an example of a sensor according to some example embodiments.

FIG. 11 is a perspective view showing an example of a sensor according to some example embodiments and FIG.

12 is a schematic cross-sectional view showing an example of the sensor shown in FIG. 11.

Figure 12:
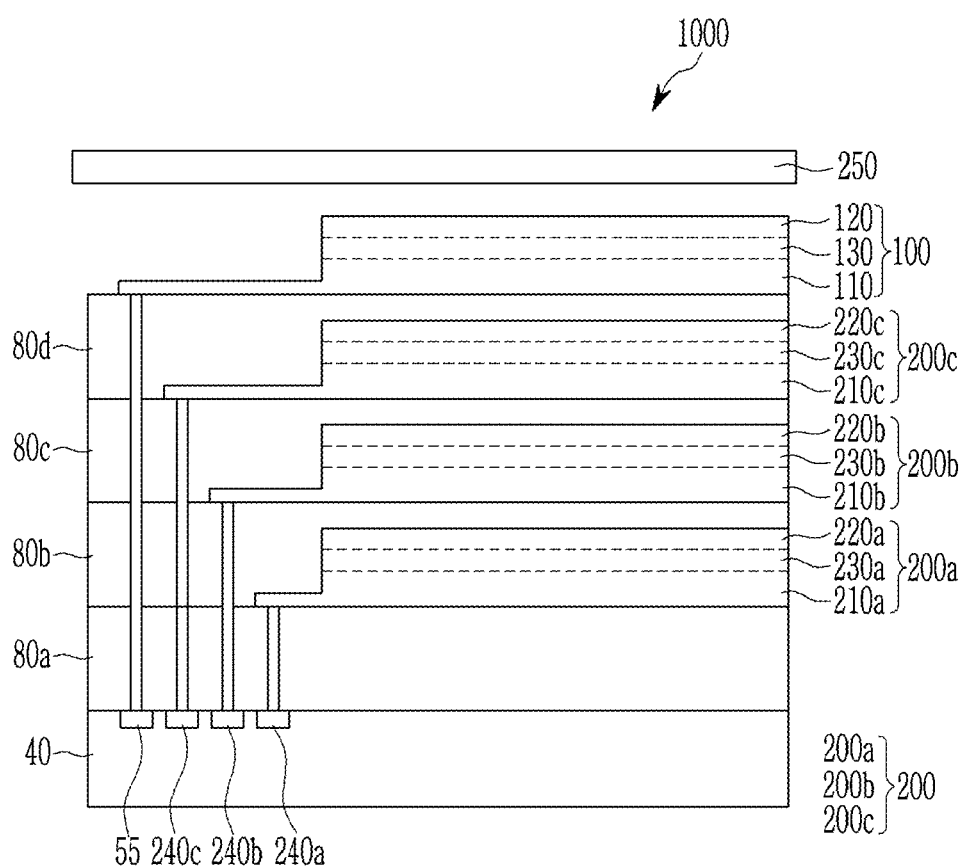
FIG. 12 is a schematic cross-sectional view showing an example of the sensor shown in FIG. 11.

Referring to FIGS. 11 and 12, the near-infrared light sensor 100 according to some example embodiments includes a semiconductor substrate 40; a near-infrared light sensor 100; a visible light sensor 200; and an optical filter 250. The visible light sensor 200 includes a blue sensor 200a, a green sensor 200b, and a red sensor 200c. As shown in FIGS. 11 and 12, each sensor of the blue sensor 200a, the green sensor 200b, and the red sensor 200c may be a photoelectric conversion device.

The near-infrared light sensor 100, the blue sensor 200a, the green sensor 200b, and the red sensor 200c may be stacked in a vertical direction on the semiconductor substrate 40, and may be each connected to charged storages 55, 240a, 240b, and 240c integrated in the semiconductor substrate 40.

The near-infrared light sensor 100 includes a first electrode 110, a second electrode 120, and a near-infrared photoelectric conversion layer 130 between the first electrode 110 and the second electrode 120, and specific details thereof are the same as described above.

The blue sensor 200a includes a lower electrode 210a, a blue photoelectric conversion layer 230a, and an upper electrode 220a. The green sensor 200b includes a lower electrode 210b, a green photoelectric conversion layer 230b, and an upper electrode 220b. The red sensor 200c includes a lower electrode 210c, a red photoelectric conversion layer 230c, and an upper electrode 220c. In some example embodiments, the blue sensor 200a includes a blue photoelectric conversion layer 230a configured to absorb light in the blue wavelength spectrum (e.g., first light) and convert the light into a first electrical signal, the green sensor 200b includes a green photoelectric conversion layer 230b configured to absorb light in a green wavelength spectrum (e.g., second light) and convert the light into a second electrical signal, and the red sensor 200c includes a red photoelectric conversion layer 230c configured to absorb light in a red wavelength spectrum (e.g., third light) and convert the light into a third electrical signal.

Insulation layers 80a, 80b, 80c, and 80d are respectively disposed between the semiconductor substrate 40 and the blue sensor 200a, between the blue sensor 200a and the green sensor 200b, between the green sensor 200b and the red sensor 200c, and between the red sensor 200c and the near-infrared light sensor 100.

In some example embodiments, a structure of sequentially stacking the near-infrared light sensor 100, the blue sensor 200a, the green sensor 200b, and the red sensor 200c is exemplarily illustrated but not limited thereto, and the present disclosure may have unlimitedly various stacking orders.

The aforementioned sensor may be applied to various electronic devices, for example mobile phones, digital cameras, biometric devices, and/or automotive electronic components, but is not limited thereto.

Figure 13:
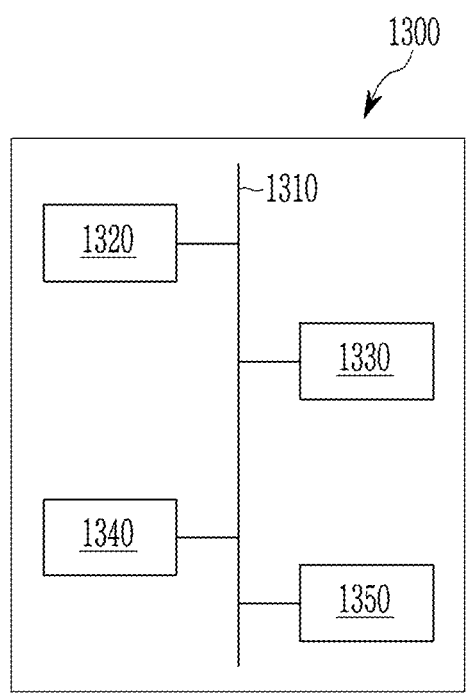
FIG. 13 is a schematic diagram of an electronic device according to some example embodiments.

FIG. 13 is a schematic diagram of an electronic device according to an example.

Referring to FIG. 13, an electronic device 1300 includes a processor 1320, a memory 1330, a sensor 1340, and a display device 1350 electrically connected through a bus 1310. The sensor 1340 may be any of the aforementioned various sensors (100, 300, 400, 500, 600, 700, 800, 900, 1000). The processor 1320 may perform a memory program and thus at least one function. The processor 1320 may additionally perform a memory program and thus display an image on the display device 1350. The processor 1320 may generate an output.

Hereinafter, some example embodiments are illustrated in more detail with reference to examples. However, the present scope is not limited thereto.

EXAMPLES

Example 1

ITO is sputtered on a glass substrate to form a 150 nm-thick anode (a work function: 4.7 eV). On the anode, a compound represented by Chemical Formula A is deposited to form a 10 nm-thick electron blocking layer. On the electron blocking film, a first material represented by Chemical Formula B ($\lambda_{max}$: 870 nm, HOMO: 5.1 eV, LUMO: 4.0 eV) and a second material represented by $C_{60}$ ($\lambda_{max}$: 450 nm, HOMO: 6.4 eV, LUMO: 4.3 eV) is co-deposited in a thickness ratio (a volume ratio) of 0.10:1 to form a 165 nm-thick near-infrared photoelectric conversion layer. On the near-infrared photoelectric conversion layer, ITO is sputtered to form a 7 nm-thick cathode (a work function: 4.5 eV). On a cathode, aluminum oxide ($Al_2O_3$) is deposited to form a 50 nm-thick anti-reflection layer, and then, a glass plate is used for sealing to manufacture a near-infrared light sensor.

[Chemical Formula A]

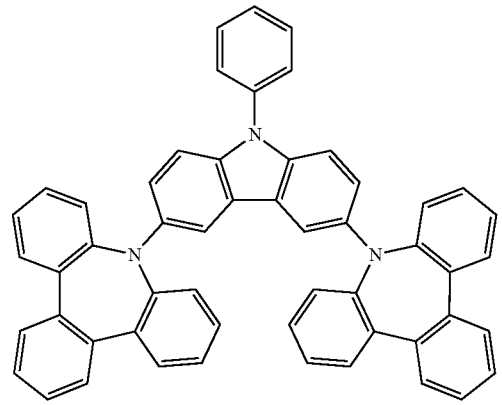

[Chemical Formula B]

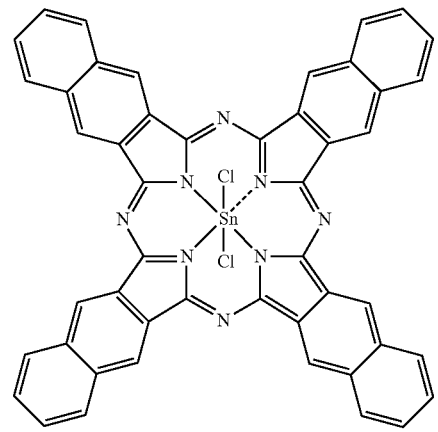

Example 2

A near-infrared light sensor is manufactured according to the same method as Example 1 except that the first material and the second material in a thickness ratio (a volume ratio) of 0.20:1 are co-deposited to form an 180 nm-thick near-infrared photoelectric conversion layer.

Example 3

A near-infrared light sensor is manufactured according to the same method as Example 1 except that the first material and the second material in a thickness ratio (a volume ratio) of 0.27:1 are co-deposited to form an 190 nm-thick near-infrared photoelectric conversion layer.

Example 4

A near-infrared light sensor is manufactured according to the same method as Example 1 except that the first material and the second material in a thickness ratio (a volume ratio) of 0.50:1 are co-deposited to form a 225 nm-thick near-infrared photoelectric conversion layer.

Example 5

A near-infrared light sensor is manufactured according to the same method as Example 1 except that the first material and the second material in a thickness ratio (a volume ratio) of 0.20:1 are co-deposited to form a 240 nm-thick near-infrared photoelectric conversion layer.

Example 6

A near-infrared light sensor is manufactured according to the same method as Example 1 except that the first material and the second material in a thickness ratio (a volume ratio) of 0.27:1 are co-deposited to form a 254 nm-thick near-infrared photoelectric conversion layer.

Example 7

A near-infrared light sensor is manufactured according to the same method as Example 1 except that the first material and the second material in a thickness ratio (a volume ratio) of 0.32:1 are co-deposited to form a 330 nm-thick near-infrared photoelectric conversion layer.

Example 8

A near-infrared light sensor is manufactured according to the same method as Example 1 except that the first material and the second material in a thickness ratio (a volume ratio) of 0.33:1 are co-deposited to form a 400 nm-thick near-infrared photoelectric conversion layer.

Example 9

A near-infrared light sensor is manufactured according to the same method as Example 1 except that the first material and the second material in a thickness ratio (a volume ratio) of 0.40:1 are co-deposited to form a 280 nm-thick near-infrared photoelectric conversion layer.

Example 10

A near-infrared light sensor is manufactured according to the same method as Example 1 except that the first material and the second material in a thickness ratio (a volume ratio) of 0.32:1 are co-deposited to form a 330 nm-thick near-infrared photoelectric conversion layer, and the second material alone is deposited thereon to be 30 nm thick.

Reference Example

A near-infrared light sensor is manufactured according to the same method as Example 1 except that the first material and the second material in a thickness ratio (a volume ratio) of 1:1 are co-deposited to form a 200 nm-thick near-infrared photoelectric conversion layer.

Evaluation I

Each dark current of the near-infrared light sensors according to Examples and Reference Examples is evaluated under a reverse bias voltage.

The dark current is measured after a heat-treatment at 170° C. for 3 hours by using a current-voltage evaluation equipment (Keithley K4200 parameter analyzer) and then, divided by a unit pixel area (0.04 cm$^2$) to evaluate dark current density, and the dark current density is evaluated from a current flowing when −3V reverse bias is applied.

The results are shown in Table 1.

TABLE 1

|  | Dark current density (h/s/μm$^2$) |
| --- | --- |
| Example 1 | 127,318 |
| Example 2 | 79,861 |
| Example 3 | 472,442 |
| Example 4 | 829,462 |
| Example 5 | 273,664 |
| Example 6 | 191,366 |
| Example 7 | 330,462 |
| Example 8 | 274,702 |
| Example 9 | 629,236 |
| Example 10 | 287,936 |
| Reference Example | 94,701,400 |

Referring to Table 1, the near-infrared light sensors according to Examples exhibit a greatly decreased dark current compared with the near-infrared light sensor according to Reference Example.

Evaluation II

Photoelectric conversion efficiency of the near-infrared light sensors according to Examples and Reference Example is evaluated. The photoelectric conversion efficiency is evaluated from external quantum efficiency (EQE) after the heat-treatment at 170° C. for 3 hours using an Incident Photon to Current Efficiency (IPCE) method in a wavelength spectrum of 800 nm to 1300 nm.

The results are shown in Table 2.

TABLE 2

|  | EQE (@870 nm) (%) |
| --- | --- |
| Example 1 | 18.4 |
| Example 2 | 31.6 |
| Example 3 | 31.4 |
| Example 4 | 28.9 |
| Example 5 | 14.7 |
| Example 6 | 17.8 |
| Example 7 | 17.1 |
| Example 8 | 22.2 |
| Example 9 | 27.9 |
| Example 10 | 26.5 |
| Reference Example 1 | 15.0 |

Referring to Table 2, the near-infrared light sensors according to Examples exhibit equivalent or improved photoelectric conversion efficiency compared with the near-infrared light sensor according to Reference Example.

Comprehensively examining the results, near-infrared light sensors according to Examples exhibit a greatly decreased dark current under the reverse bias voltage with equivalent or improved photoelectric conversion efficiency compared with the near-infrared light sensor according to Reference Example.

While this disclosure has been described in connection with what is presently considered to be practical example embodiments, it is to be understood that the inventive concepts are not limited to the disclosed example embodiments. On the contrary, it is intended to cover various modifications and equivalent arrangements included within the spirit and scope of the appended claims.

What is claimed is:

1. A sensor, comprising:
an anode and a cathode, each of the anode and the cathode including an oxide conductor;
a near-infrared photoelectric conversion layer between the anode and the cathode, the near-infrared photoelectric conversion layer configured to absorb light of at least a portion of a near-infrared wavelength spectrum and convert the absorbed light into an electrical signal, and
a first charge auxiliary layer between the near-infrared photoelectric conversion layer and the cathode,
wherein the near-infrared photoelectric conversion layer includes
 a first amount of a first material, the first material being a p-type semiconductor and having a maximum absorption wavelength in the near-infrared wavelength spectrum, and
 a second amount of a second material, the second material being an n-type semiconductor forming a pn junction with the first material and an energy bandgap of the second material being wider than an energy bandgap of the first material,
wherein a difference between a highest occupied molecular orbital (HOMO) energy level of the first material and a work function of the cathode is less than about 0.8 eV,
wherein a difference between a highest occupied molecular orbital (HOMO) energy level of the first charge auxiliary layer and the work function of the cathode is greater than or equal to about 1.5 eV, and
wherein a composition ratio of the first material relative to the second material is about 0.10 to about 0.50.

2. The sensor of claim 1, wherein a difference between a highest occupied molecular orbital (HOMO) energy level of the second material and the HOMO energy level of the first material is greater than or equal to about 1.0 eV.

3. The sensor of claim 1, wherein a difference between a highest occupied molecular orbital (HOMO) energy level of the second material and the work function of the cathode is greater than or equal to about 1.5 eV.

4. The sensor of claim 1, wherein the energy bandgap of the second material is wider than the energy bandgap of the first material by about 0.5 eV to about 2.0 eV.

5. The sensor of claim 1, wherein a maximum absorption wavelength of the second material is not within the near-infrared wavelength spectrum.

6. The sensor of claim 1, wherein the near-infrared photoelectric conversion layer comprises a mixed layer including a mixture of the first material and the second material.

7. The sensor of claim 1, wherein a maximum absorption wavelength of the near-infrared photoelectric conversion layer is within about 750 nm to about 1500 nm.

8. The sensor of claim 1, further comprising:
a second charge auxiliary layer between the near-infrared photoelectric conversion layer and the anode.

9. The sensor of claim 8, wherein a difference between a lowest unoccupied molecular orbital (LUMO) energy level of the second charge auxiliary layer and a work function of the anode is greater than or equal to about 1.5 eV.

10. The sensor of claim 1, further comprising:
a semiconductor substrate, wherein the cathode, anode, and near-infrared photoelectric conversion layer are stacked on the semiconductor substrate.

11. The sensor of claim 10, further comprising:
a visible light sensor configured to detect light in a visible wavelength spectrum.

12. The sensor of claim 11, wherein
the visible light sensor includes
 a blue sensor configured to sense light in a blue wavelength spectrum,
 a green sensor configured to sense light in a green wavelength spectrum, and
 a red sensor configured to sense light in a red wavelength spectrum,
wherein the blue sensor, the green sensor and the red sensor are integrated in the semiconductor substrate.

13. The sensor of claim 11, wherein
the visible light sensor includes
 a blue sensor configured to sense light in a blue wavelength spectrum,
 a green sensor configured to sense light in a green wavelength spectrum, and
 a red sensor configured to sense light in a red wavelength spectrum,
wherein two sensors of the blue sensor, the green sensor, or the red sensor are photodiodes integrated in the semiconductor substrate, and
a remaining one sensor of the blue sensor, the green sensor, and the red sensor is a photoelectric conversion device on the semiconductor substrate.

14. The sensor of claim 13, wherein the photoelectric conversion device includes a visible photoelectric conversion layer between a pair of electrodes, the visible photoelectric conversion layer configured to absorb visible light of one wavelength spectrum of the blue wavelength spectrum, the green wavelength spectrum, or the red wavelength spectrum to convert the absorbed visible light into a visible light electrical signal.

15. The sensor of claim 11, wherein
the visible light sensor includes
 a blue sensor configured to sense light in a blue wavelength spectrum,
 a green sensor configured to sense light in a green wavelength spectrum, and
 a red sensor configured to sense light in a red wavelength spectrum,
wherein each sensor of the blue sensor, the green sensor, and the red sensor is a photoelectric conversion device.

16. The sensor of claim 15, wherein
the blue sensor includes a blue photoelectric conversion layer configured to absorb first light in the blue wavelength spectrum and convert the first light into a first electrical signal,
the green sensor includes a green photoelectric conversion layer configured to absorb second light in the green wavelength spectrum and convert the second light into a second electrical signal, and the red sensor includes a red photoelectric conversion layer configured to absorb third light in the red wavelength spectrum and convert the third light into a third electrical signal.

17. An electronic device comprising the sensor of claim 1.

\* \* \* \* \*